United States Patent [19]
White

[11] Patent Number: 5,566,093
[45] Date of Patent: Oct. 15, 1996

[54] SENSOR WITH RESONATOR, DIGITAL FILTER, AND DISPLAY

[75] Inventor: Stanley A. White, San Clemente, Calif.

[73] Assignee: Rockwell International Corporation, Seal Beach, Calif.

[21] Appl. No.: 383,142

[22] Filed: Feb. 3, 1995

[51] Int. Cl.⁶ .................................................. H03H 17/00
[52] U.S. Cl. ........................................................... 364/572
[58] Field of Search ........................ 364/715.01, 724.01, 364/724.1, 724.2, 602, 572, 574, 581; 327/558; 375/229; 342/145; 324/76.46, 76.28, 76.29, 76.44, 76.49

Primary Examiner—James P. Trammell
Assistant Examiner—Tony M. Cole
Attorney, Agent, or Firm—George A. Montanye; Charles T. Silberberg; Tom Streeter

[57] ABSTRACT

A resonator produces a signal which is processed by being digitized and demodulated. The processed signal is applied to a filter having three sections. The first is a lowpass filter, the second is a decimator, and the third is an equalizer filter. The lowpass filter filters out the high frequency components which would be aliased by the decimator. The equalizer filter performs whatever processing as is appropriate for the measurement which is sought. A second or subsequent equalizer filter may be driven by the first. The lowpass filter and the equalizer filters all have the same architecture of allpass filters, weighting elements, and adders. The weights applied to the weighting elements vary to perform the varied purposes of the various filters. The filtered signal is applied to a display, such as a human operator, or a device (such as an auto-pilot) either in or out of a feedback loop, or both.

18 Claims, 4 Drawing Sheets

5,566,093

SENSOR WITH RESONATOR, DIGITAL FILTER, AND DISPLAY

BACKGROUND OF THE INVENTION

This invention pertains to digital filters and has particular application to filters for the digitized output of a resonator used as a sensor.

Resonators (whether mechanical, electrical, or otherwise) are useful sensors. They can be constructed so that, as the sensor's body motion, temperature, or pressure changes, so does the amplitude of the resonance. An H-shaped quartz resonator, for example, acts as an angular rate sensor. Other equivalent applications are known in the art.

It is not enough, however, to have a resonator. An electrical signal must be extracted from the resonator, and this signal must be processed to produce a useful measurement from the sensor.

SUMMARY OF THE INVENTION

This invention provides such useful measurements. The raw analog data signal from the resonator is a double sideband suppressed carrier modulated information signal. This signal is digitized in a first analog-to-digital converter (ADC) to produce a digitized data signal. The carrier signal is available from the resonator (actually, from the drive circuit which excites the resonator). This carrier signal is digitized in a second ADC to form a digitized demodulation reference signal. This demodulation reference signal is processed by having its frequency shifted and its gain and phase adjusted, in light of the particular resonator at hand and in light of the measurement which is desired to be made. This processed demodulation reference signal is used to demodulate the digitized data signal.

The demodulated digitized data signal must now be filtered, and the present invention provides the apparatus to do so.

The filter generally has been designed to attenuate high frequency noise, and to attenuate mode signals. A mode signal is a signal generated when the resonator resonates in one or more undesired modes in addition to the desired mode. The filter also provides amplitude and phase equalization of a servo's frequency response, if the signal is injected into a servo loop. This is important if the present invention is being used in vehicle stabilization (closed loop), although it may also be used open loop, in which case no servo compensation is required. In any event, open loop or closed, some pre-established transfer function must be preserved.

The filter has three sections. The first is a lowpass filter section, the second is a decimator section, and the third is an equalizer (transfer function mechanizing) filter section.

The lowpass filter section has two purposes. First, it acts as the lowpass part of the original, pre-established transfer function. Second, it attenuates the high frequency components which would be aliased by the decimator.

The decimator section lowers the sampling rate from the resonator. The sampling rate generally follows the operating frequency of the resonator. This frequency should be high, since a high frequency resonator is more accurate and sensitive than one with a lower frequency. The decimator section allows the equalizer filter section to operate at a lower frequency. This lowers the round off errors in the equalizer filter section by operating it in the (lower) frequency range in which it is most accurate and sensitive. This frequency range is lower because the demodulated information extracted from the resonator is naturally concentrated in the lower frequencies.

The equalizer filter performs the remaining processing which is appropriate for the measurement to be sought; some of the equalization has already taken place in the lowpass filter. A second or subsequent equalizer filter may be driven by the first. The lowpass filter and the equalizer filters jointly mechanize the pre-established transfer function. They most conveniently all have the same architecture, namely, allpass filters, weighting elements, and adders. The weights applied to the weighting elements vary to perform the varied purposes of the various filters. The allpass filters likewise have weighting elements with varying weights to perform the same varied purposes.

The filtered signal may then be applied to a display. The display may be to a human operator, or to a device (such as an auto-pilot) either in or out of a feedback loop, or both.

DETAILED DESCRIPTION OF THE DRAWINGS

Figure 1:
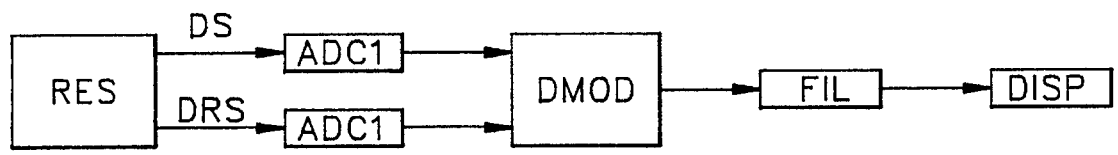
FIG. 1 is a block diagram of this invention.

In FIG. 1, a resonator RES produces a data signal DS and a demodulation reference signal DRS. The data signal DS is digitized in a first analog-to-digital converter ADC1 and the demodulation reference signal DRS is digitized in a second analog-to-digital converter ADC2. The signals emerging from ADC1 and ADC 2 drive a demodulator DMOD, which also provides frequency shifting, and further provides gain phase adjustment. The signal from DMOD drives a filter FIL, which in turn drives a display DISP. The display DISP may be to a human operator, or to a device (such as an auto-pilot) either in or out of a feedback loop, or both.

Figure 2:
FIG. 2 is a block diagram of the filter used in FIG. 1.

FIG. 2 is a block diagram of the filter FIL. The input drives a lowpass filter LPF, which drives a decimator DEC, which drives an equalization filter EQF. The output of EQF is the output of the filter FIL.

Figure 3:
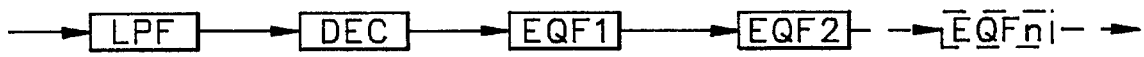
FIG. 3 is a block diagram of a more complex version of the filter shown in FIG. 2.

In FIG. 3, the equalization filter EQF has been replaced by cascaded equalization filters EQF1 and EQF2. Additional equalization filters EQFn may be added if required.

Figure 4:
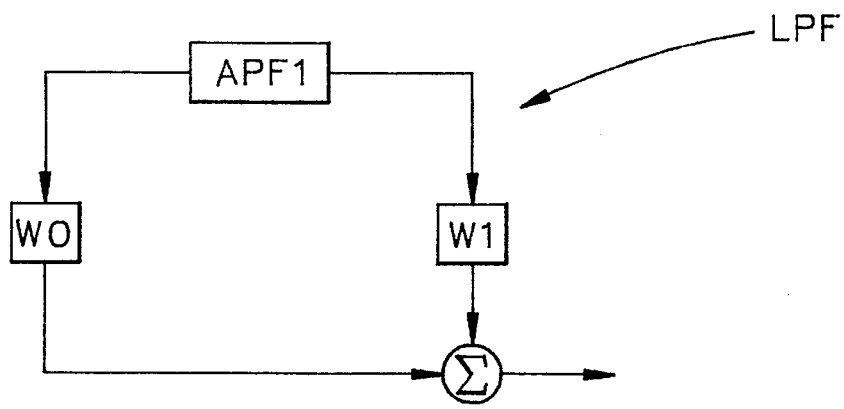
FIG. 4 is a block diagram of a simple version of the lowpass filter, and the equalizer filter, shown in FIGS. 2 and 3.

FIG. 4 shows the architecture of a simple version of the lowpass filter LPF. The input signal drives a first allpass filter APF1, which in turn drives a first weighting element W1. The input signal also drives a zeroth weight element W0 without any intervening allpass filter. The outputs of W0 and W1 are applied to an adder shown by a sigma in a circle. The output of the adder is the output of LPF. An identical architecture may be used for the equalization filter EQF. Only the weights of the weighting elements W0 and W1 would be changed to accord with its changed function. Weights internal to the allpass filter APF1 could also be changed, also without change to its architecture.

Figure 5:
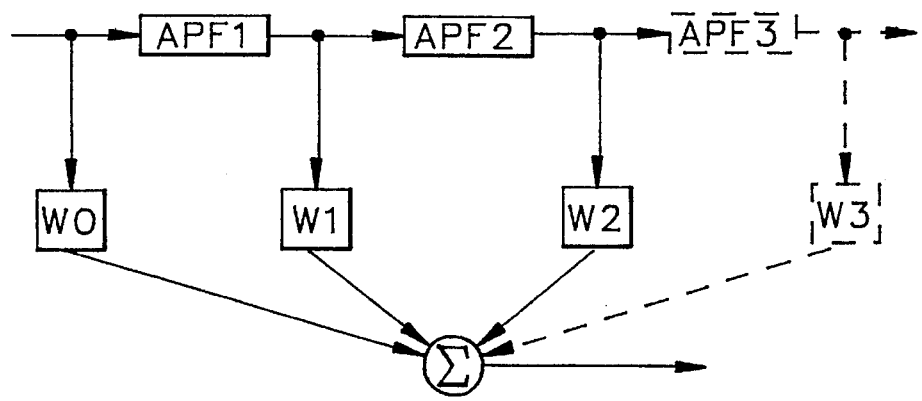
FIG. 5 is a block diagram of a more complex version of the filter shown in FIG. 4.

FIG. 5 extends FIG. 4. In FIG. 5, a second allpass filter APF2, driven by the first allpass filter APF1 and driving a second weighting element W2, is shown. Also shown, in dotted line, is a third allpass filter APF3 and third weighting element W3, similarly driving and driven. Additional allpass filters and weighting elements may be used as desired. Regardless of the number of allpass filters and weighting elements, the outputs of the weighting elements are added together by the adder to form the output of the filter. The adder shown is centralized (non-22 distributed).

Figure 6:
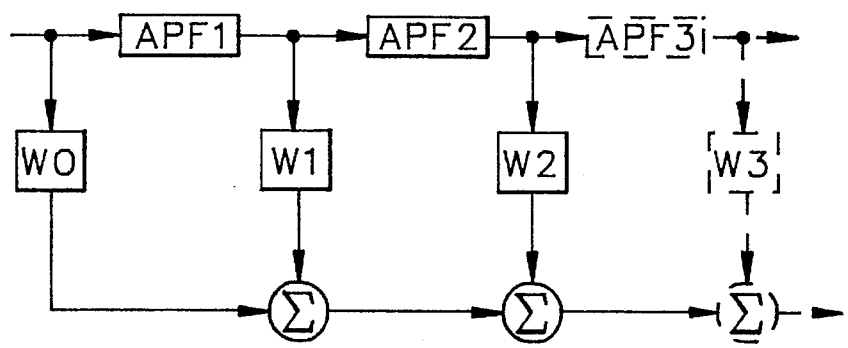
FIG. 6 is a distributed version of the filter shown in FIG. 5.

FIG. 6 is a distributed version of the filter shown in FIG. 5. The centralized adder of FIG. 5 has been changed to a distributed adder, but the architecture of the filter is otherwise unchanged.

Figure 7:
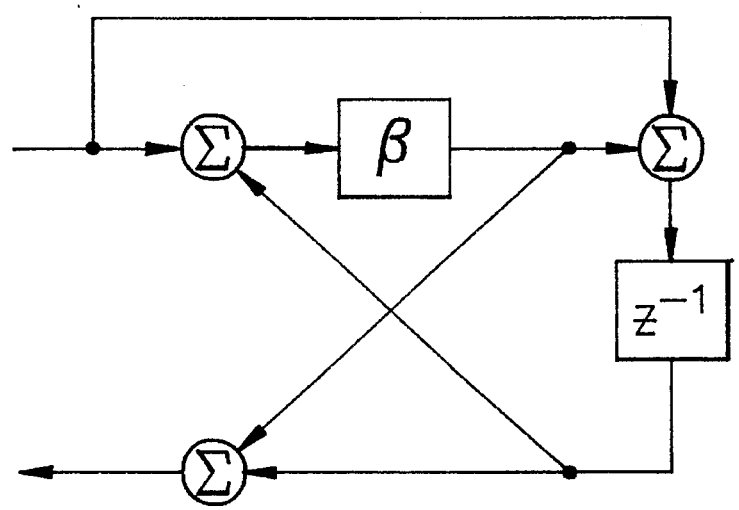
FIG. 7 is a block diagram of a first preferred first-order version of the allpass filter shown in FIGS. 4 and 5.

FIG. 7 shows a first preferred first order alipass filter, namely, a first order Gray-Markel filter. This filter is well known in the prior art, and therefore will not be discussed further.

Figure 8:
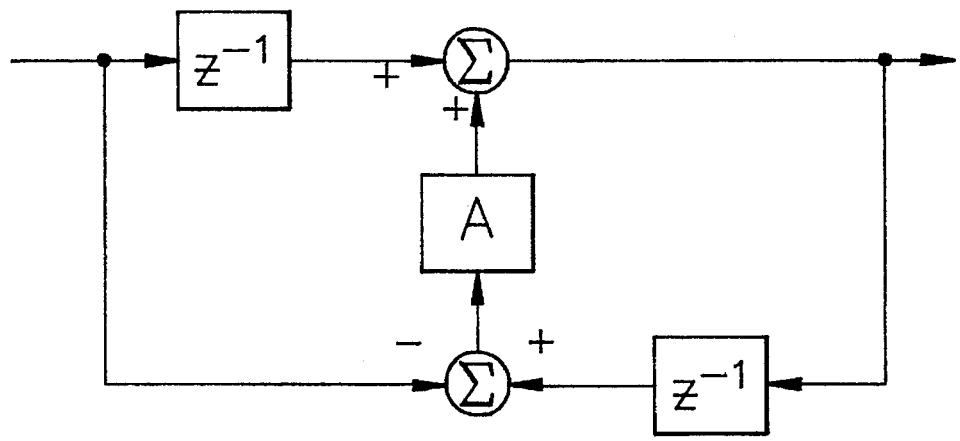
FIG. 8 is a block diagram of a second preferred first-order version of the allpass filter shown in FIGS. 4 and 5.

FIG. 8 shows a second preferred first order allpass filter, namely, a Mitra Hirano type 1A transpose filter. This filter is also well known in the prior art. In it, the input signal drives a first delay element and (at a negative input) a subtracter. The output of the subtracter drives a weighting element A, which in turn drives a summer. The first delay element also drives the summer. The output of the summer is the output of the filter, and also drives a second delay element, which in turn drives the positive input of the subtracter.

Figure 9:
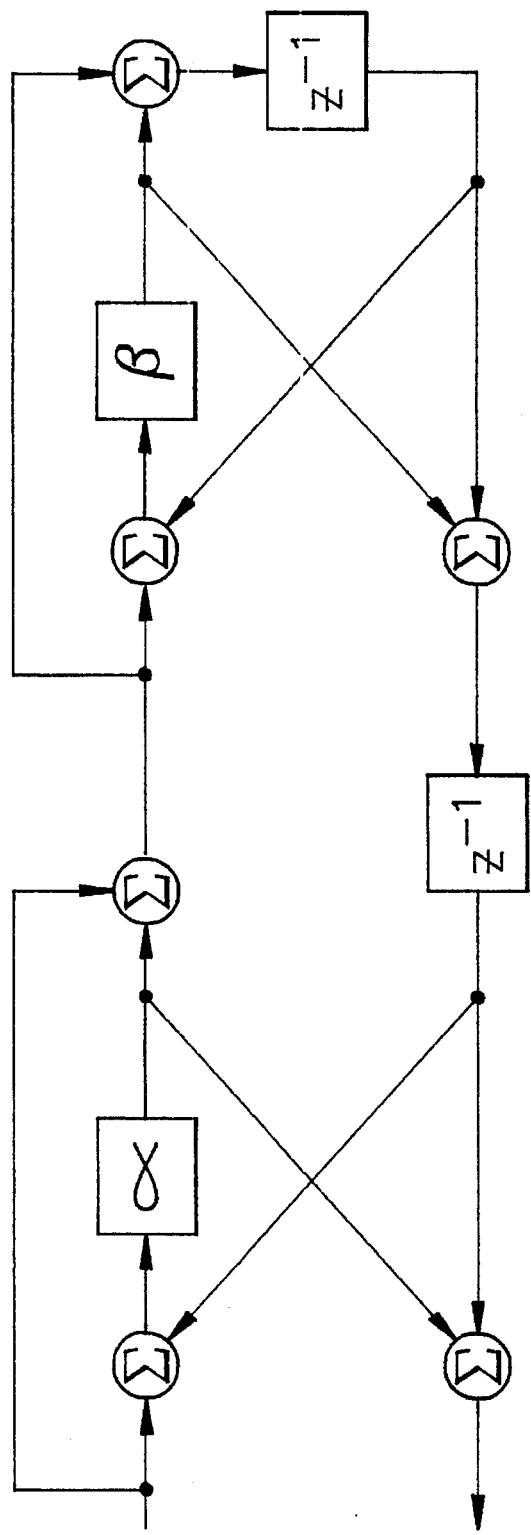
FIG. 9 is a block diagram of a preferred second-order version of the allpass filter shown in FIGS. 4, 5, and 6.

FIG. 9 shows a preferred second order allpass filter, namely, a second order Gray-Markel filter. This filter is also well known in the prior art, and therefore also will not be discussed further.

Scope of the Invention

Several embodiments of this invention have been shown, but the true spirit and scope of the invention are not limited thereto. They are limited only by the following claims, and their equivalents.

What is claimed is:

1. A sensor, comprising:
    (a) a resonator;
    (b) means, connected to the resonator, for digitizing and demodulating a signal from the resonator;
    (c) a lowpass filter connected to receive a filter input signal from the digitizing and demodulating means;
    (d) a decimator connected to receive a filter output signal from the lowpass filter;
    (e) an equalizer filter connected to receive a filter input signal from the decimator; and
    (f) a display connected to receive a filter output signal from the equalizer filter;
   wherein:
    (g) each lowpass filter and equalizer filter comprises:
        (1) a zeroth weighting element connected to receive and weight the filter input signal, and connected to produce a zeroth weighted output signal; and
        (2) a section comprising:
            (A) an allpass filter connected to receive the filter input signal, and connected to produce a first unweighted output signal; and
            (B) a first weighting element connected to receive and weight the first unweighted output signal, and connected to produce a first weighted output signal; and
        (3) an adder connected to receive and add the weighted output signals and connected to produce a sum signal, the sum signal being the output signal of the filter;
    (h) the lowpass weighting elements have weights selected to cause the lowpass filter to preferentially pass low frequency signals; and
    (i) the equalizer weighting elements have weights selected to cause the equalizer filter to have a preselected response.

2. The sensor of claim 1, wherein:
    (a) the section of the lowpass filter is a first section; and
    (b) the lowpass filter further comprises a second section comprising:
        (1) a second allpass filter connected to receive the output signal of the first allpass filter, and connected to produce a second unweighted output signal; and
        (2) a second weighting element connected to receive and weight the second unweighted output signal, and connected to produce a second weighted output signal.

3. The sensor of claim 2, wherein the lowpass filter further comprises at least one additional section comprising:
    (a) an additional allpass filter connected to receive the output signal of a preceding allpass filter, and connected to produce an additional unweighted output signal; and
    (b) an additional weighting element connected to receive and weight the additional unweighted output signal, and connected to produce an additional weighted output signal.

4. The sensor of claim 1, wherein:
    (a) the section of the equalizer filter is a first section; and
    (b) the equalizer filter further comprises a second section comprising:
        (1) a second allpass filter connected to receive the output signal of the first allpass filter, and connected to produce a second unweighted output signal; and
        (2) a second weighting element connected to receive and weight the second unweighted output signal, and connected to produce a second weighted output signal.

5. The sensor of claim 4, wherein the equalizer filter further comprises at least one additional section comprising:
    (a) an additional allpass filter connected to receive the output signal of a preceding allpass filter, and connected to produce an additional unweighted output signal; and
    (b) an additional weighting element connected to receive and weight the additional unweighted output signal, and connected to produce an additional weighted output signal.

6. The sensor of claim 1, wherein:
    (a) the equalizer filter is a first equalizer filter and has an architecture; and
    (b) the sensor further comprises at least one additional equalizer filter, having an architecture equal to the architecture of the first equalizer filter, connected to receive an output signal from a previous equalizer filter and to produce an output signal; and
    (c) an output of one such additional equalizer filter is an input to the display.

7. The sensor of claim 2, wherein:

(a) the equalizer filter is a first equalizer filter and has an architecture; and (b) the sensor further comprises at least one additional equalizer filter, having an architecture equal to the architecture of the first equalizer filter, connected to receive an output signal from a previous equalizer filter and to produce an output signal; and (c) an output of one such additional equalizer filter is an input to the display.

8. The sensor of claim 3, wherein:

(a) the equalizer filter is a first equalizer filter and has an architecture; and (b) the sensor further comprises at least one additional equalizer filter, having an architecture equal to the architecture of the first equalizer filter, connected to receive an output signal from a previous equalizer filter and to produce an output signal; and (c) an output of one such additional equalizer filter is an input to the display.

9. The sensor of claim 4, wherein:

(a) the equalizer filter is a first equalizer filter and has an architecture; and (b) the sensor further comprises at least one additional equalizer filter, having an architecture equal to the architecture of the first equalizer filter, connected to receive an output signal from a previous equalizer filter and to produce an output signal; and (c) an output of one such additional equalizer filter is an input to the display.

10. The sensor of claim 5, wherein:

(a) the equalizer filter is a first equalizer filter and has an architecture; and (b) the sensor further comprises at least one additional equalizer filter, having an architecture equal to the architecture of the first equalizer filter, connected to receive an output signal from a previous equalizer filter and to produce an output signal; and (c) an output of one such additional equalizer filter is an input to the display.

11. The sensor of claim 11, wherein:

(a) the section of the lowpass filter is a first section;

(b) the allpass filter of the lowpass filter is a first allpass filter;

(c) the adder of the lowpass filter is a first adder;

(d) the sum signal of the lowpass filter is a first sum signal; and (e) the lowpass filter further comprises a second section comprising:

(1) a second allpass filter connected to receive the first unweighted output signal, and connected to produce a second unweighted output signal;

(2) a second weighting element connected to receive and weight the second unweighted output signal, and connected to produce a second weighted output signal; and (3) a second adder connected to receive and add the second weighted output signal and the first sum signal, and connected to produce a second sum signal, the second sum signal being the output signal of the filter.

12. The sensor of claim 11 wherein the lowpass filter further comprises at least one additional section comprising:

(a) an additional allpass filter connected to receive the unweighted output signal of a previous allpass filter, and connected to produce an additional unweighted output signal;

(b) an additional weighting element connected to receive and weight the additional unweighted output signal, and connected to produce an additional weighted output signal; and (c) an additional adder connected to receive and add the additional weighted output signal and the sum signal of a previous adder, and connected to produce an additional sum signal, the additional sum signal being the output signal of the filter.

13. The sensor of claim 1, wherein:

(a) the section of the equalizer filter is a first section;

(b) the allpass filter of the equalizer filter is a first allpass filter;

(c) the adder of the equalizer filter is a first adder;

(d) the sum signal of the equalizer filter is a first sum signal; and (e) the equalizer filter further comprises a second section comprising:

(1) a second allpass filter connected to receive the first unweighted output signal, and connected to produce a second unweighted output signal;

(2) a second weighting element connected to receive and weight the second unweighted output signal, and connected to produce a second weighted output signal; and (3) a second adder connected to receive and add the second weighted output signal and the first sum signal, and connected to produce a second sum signal, the second sum signal being the output signal of the filter.

14. The sensor of claim 13, wherein the equalizer filter further comprises at least one additional section comprising:

(a) an additional alipass filter connected to receive the unweighted output signal of a previous allpass filter, and connected to produce an additional unweighted output signal;

(b) an additional weighting element connected to receive and weight the additional unweighted output signal, and connected to produce an additional weighted output signal; and (c) an additional adder connected to receive and add the additional weighted output signal and the sum signal of a previous adder, and connected to produce an additional sum signal, the additional sum signal being the output signal of the filter.

15. The sensor of claim 11, wherein:

(a) the equalizer filter is a first equalizer filter and has an architecture; and (b) the sensor further comprises at least one additional equalizer filter, having an architecture equal to the architecture of the first equalizer filter, connected to receive an output signal from a previous equalizer filter and to produce an output signal; and (c) an output of one such additional equalizer filter is an input to the display.

16. The sensor of claim 12, wherein:

(a) the equalizer filter is a first equalizer filter and has an architecture; and (b) the sensor further comprises at least one additional equalizer filter, having an architecture equal to the architecture of the first equalizer filter, connected to receive an output signal from a previous equalizer filter and to produce an output signal; and (c) an output of one such additional equalizer filter is an input to the display.

17. The sensor of claim 13, wherein:
(a) the equalizer filter is a first equalizer filter and has an architecture; and
(b) the sensor further comprises at least one additional equalizer filter, having an architecture equal to the architecture of the first equalizer filter, connected to receive an output signal from a previous equalizer filter and to produce an output signal; and
(c) an output of one such additional equalizer filter is an input to the display.

18. The sensor of claim 14, wherein:
(a) the equalizer filter is a first equalizer filter and has an architecture; and
(b) the sensor further comprises at least one additional equalizer filter, having an architecture equal to the architecture of the first equalizer filter, connected to receive an output signal from a previous equalizer filter and to produce an output signal; and
(c) an output of one such additional equalizer filter is an input to the display.

* * * * *